United States Patent
Kim et al.

(10) Patent No.: US 11,959,974 B2
(45) Date of Patent: Apr. 16, 2024

(54) PRESSURIZING SHORT-CIRCUIT INSPECTION APPARATUS FOR DETECTING LOW-VOLTAGE DEFECTIVE POUCH-TYPE SECONDARY BATTERY CELL

(71) Applicant: LG ENERGY SOLUTION, LTD., Seoul (KR)

(72) Inventors: Jin-Gon Kim, Daejeon (KR); Cha-Hun Ku, Daejeon (KR); Su-Taek Jung, Daejeon (KR); Jung-Kwan Pyo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 441 days.

(21) Appl. No.: 17/415,473

(22) PCT Filed: Aug. 10, 2020

(86) PCT No.: PCT/KR2020/010561
§ 371 (c)(1),
(2) Date: Jun. 17, 2021

(87) PCT Pub. No.: WO2021/054605
PCT Pub. Date: Mar. 25, 2021

(65) Prior Publication Data
US 2022/0065948 A1 Mar. 3, 2022

(30) Foreign Application Priority Data
Sep. 18, 2019 (KR) .................. 10-2019-0114920

(51) Int. Cl.
*G01R 31/52* (2020.01)
*H01M 10/04* (2006.01)
*H01M 10/42* (2006.01)

(52) U.S. Cl.
CPC ........ *G01R 31/52* (2020.01); *H01M 10/0481* (2013.01); *H01M 10/4285* (2013.01)

(58) Field of Classification Search
CPC ............ H01M 50/105; H01M 10/4285; G01R 31/52; G01R 31/36; G01R 31/385; Y02E 60/10
See application file for complete search history.

(56) References Cited

U.S. PATENT DOCUMENTS

| 2009/0146663 A1 | 6/2009 | Takeno et al. |
| 2011/0068800 A1 | 3/2011 | Nishino et al. |

(Continued)

FOREIGN PATENT DOCUMENTS

| JP | 2018-106930 A | 7/2018 |
| KR | 10-2009-0060186 A | 6/2009 |

(Continued)

OTHER PUBLICATIONS

International Search Report (PCT/ISA/210) issued in PCT/KR2020/010561, dated Dec. 9, 2020.

(Continued)

*Primary Examiner* — Lisa M Caputo
*Assistant Examiner* — Cynthia L Davis
(74) *Attorney, Agent, or Firm* — Birch, Stewart, Kolasch & Birch, LLP

(57) ABSTRACT

A pressurizing short-circuit inspection apparatus, which includes compression plates arranged with a predetermined separation distance therebetween so that at least one of secondary battery cells is inserted therein, the compression plates being moved in ±X-axis direction to adjust the separation distance; and a pressurizing short-circuit inspection assembly having a cell pressing unit configured to press a predetermined region of a body of the secondary battery cell and a power supply unit provided in contact with an electrode lead of the secondary battery cell to apply a test (Continued)

voltage, the pressurizing short-circuit inspection assembly being respectively mounted to the compression plates to be movable along ±Y-axis direction, is provided.

10 Claims, 10 Drawing Sheets

(56) References Cited

U.S. PATENT DOCUMENTS

2015/0091578 A1    4/2015   Iwase
2019/0324089 A1   10/2019   Kang et al.

FOREIGN PATENT DOCUMENTS

| KR | 10-1179347 B1 | 9/2012 |
| KR | 10-2015-0062387 A | 6/2015 |
| KR | 10-2015-0082957 A | 7/2015 |
| KR | 10-2016-0068244 A | 6/2016 |
| KR | 10-2017-0100994 A | 9/2017 |
| KR | 10-1886942 B1 | 6/2018 |
| KR | 10-2018-0111122 A | 10/2018 |
| KR | 10-2019-0006920 A | 1/2019 |
| KR | 10-1949687 B1 | 2/2019 |

OTHER PUBLICATIONS

Supplementary European Search Report dated Mar. 9, 2022 in EP 20 86 6686.

PRESSURIZING SHORT-CIRCUIT INSPECTION APPARATUS FOR DETECTING LOW-VOLTAGE DEFECTIVE POUCH-TYPE SECONDARY BATTERY CELL

TECHNICAL FIELD

The present disclosure relates to an apparatus for detecting a low-voltage defective secondary battery cell, and more particularly, to a pressurizing short-circuit inspection apparatus for detecting a low-voltage defective cell by pressing a completely packaged pouch-type secondary battery cell and applying a current thereto.

The present application claims priority to Korean Patent Application No. 10-2019-0114920 filed on Sep. 18, 2019 in the Republic of Korea, the disclosures of which are incorporated herein by reference.

BACKGROUND ART

Recently, the demand for secondary batteries as an eco-friendly energy source is rapidly increasing. Among such secondary batteries, lithium secondary batteries are being commercialized and widely used due to high energy density, high operating potential, long cycle life and low self-discharge rate.

The lithium secondary battery includes an electrode assembly in which a positive electrode plate and a negative electrode plate respectively coated with a positive electrode active material and a negative electrode active material are disposed a separator being interposed therebetween, and an exterior material, namely a battery case, for hermetically accommodating the electrode assembly together with an electrolyte.

The electrode assembly of the lithium secondary battery having a positive electrode/separator/negative electrode structure may be generally classified into a jelly-roll type (a winding type), a stacking type, and s stacking/folding type where the jelly-roll type and the stacking type are mixed, depending on the structure.

The jelly-roll type electrode assembly is prepared by coating an electrode active material on a metal foil used as a current collector, drying and pressing the metal foil, then cutting the metal foil into a band shape with desired width and length, separating the negative electrode and the positive electrode using a separator, and then spirally winding the same. The jelly-roll type electrode assembly is suitable for cylindrical batteries.

The stacking type electrode assembly has a structure in which a plurality of positive and negative electrode units are sequentially stacked, and it is easy to obtain a rectangular shape. In addition, the stacking/folding type electrode assembly is prepared by folding a full cell having a positive electrode/separator/negative electrode structure or a bi-cell having a positive electrode/separator/negative electrode/separator/positive electrode structure by using a long continuous separator film. The stacking or stacking/folding type electrode assembly is suitable for pouch-type secondary batteries.

Meanwhile, a defect by which the manufactured secondary battery exhibits a voltage drop behavior over a self-discharge rate is called a low-voltage defect, and it is believed that this defect originates from a separator defect caused by tearing, perforation or folding of the separator while the electrode assembly is being assembled.

The separator is a film made of a porous polymer that acts as an electrical insulator to prevent a physical contact between the positive electrode plate and the negative electrode plate. If the separator does not function properly as an insulator, a leakage current is generated, which may cause ignition of the secondary battery.

As an example of the defect type of the separator, referring to FIG. 1, when a stacking/folding type electrode assembly is manufactured, a folding process is performed to grip a separator 3 and a bi-cell 4 using a gripper 2 and fold the same in one direction. At this time, separator tearing 5 occurs frequently in an edge area of the separator 3.

For example, when the gripper 2 is taken out (reversed) after folding, the edge area of the separator 3 may be torn or punctured due to the stress of the gripper 2 or a foreign material stuck to the gripper 2.

In addition, during the process of stacking the electrode assemblies, the edge area of the separator may be folded inward so that the positive electrode plate and the negative electrode plate directly face each other at the corresponding folded region, or the separator may be pierced due to burr generated when an electrode tab is welded to the positive electrode plate or the negative electrode plate.

In the prior art, in order to detect whether the separator is defective as described above, a low-voltage defective cell is detected by measuring a leakage current through a hi-pot test in a state of pressurizing a body of the secondary battery cell using a jig in the shape of '[+]'.

However, at present, the jig in the shape of '[+]' presses the body of the cell so weakly not to properly induce a temporary short-circuit of the positive electrode plate and the negative electrode plate in the defective part of the separator, so exact inspection is not performed. Therefore, it is necessary to develop new equipment that may be used for pressurizing short-circuit inspection.

Meanwhile, a cell pressurizing process is used to remove air bubbles inside the cell by pressing the entire surface of the body of the secondary battery cell and increase the wetting by the electrolyte. A jig pressurizing device used in the cell pressurizing process is to press the entire surface of the body of the secondary battery cell in a pressure range different from that of the conventional pressurizing short-circuit inspection device. Thus, due to the difference in equipment specifications, the pressurizing short-circuit inspection process and the cell pressurizing process are carried out with separate devices.

Therefore, at present, in order to reduce costs and improve productivity, the development of new equipment capable of performing not only the pressurizing short-circuit inspection process but also the cell pressurizing process at once is becoming an issue.

DISCLOSURE

Technical Problem

The present disclosure is designed to solve the problems of the related art, and therefore the present disclosure is directed to providing a pressurizing short-circuit inspection apparatus, which may perform a reliable pressurizing short-circuit inspection process.

In addition, the present disclosure is also directed to reduce costs and improve productivity by integrating the pressurizing short-circuit inspection process and the cell pressurizing process with the pressurizing short-circuit inspection apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a pressurizing short-circuit inspection apparatus, comprising: compression plates arranged with a predetermined separation distance therebetween so that at least one secondary battery cells is insertable therebetween, the compression plates being movable along a first axis to adjust the separation distance; and a pressurizing short-circuit inspection assembly having a cell pressing unit configured to be pressable against a predetermined region of a body of the secondary battery cell and a power supply configured to be contactable with an electrode lead of the secondary battery cell to apply a test voltage, the pressurizing short-circuit inspection assembly being respectively mounted to the compression plates to be movable along a second axis perpendicular to the first axis.

The cell pressing unit may include balls provided at at least one surface thereof to be pressable against the body of the secondary battery cell.

The cell pressing unit may include pressurizing pads respectively disposed to overlap with a front surface and a rear surface of each compression plate, and the balls may be partially embedded in the pressurizing pad.

The cell pressing unit and the power supply may be provided to be moved together along the first axis.

The cell pressing unit may be connected to the power supply to move along the second axis with respect to the power supply.

The pressurizing short-circuit inspection assembly may further include a structure-reinforcing block unit configured to connect the cell pressing unit and the power supply into a single body.

The structure-reinforcing block unit may include an upper block configured to connect top portions of the cell pressing unit and the power supply and mounted to a top end of the compression plate to be slidable thereon; and a lower block configured to connect bottom portions of the cell pressing unit and the power supply and mounted to a bottom end of the compression plate to be slidable thereon.

The upper block and the lower block may include first linear motion (LM) sliders provided to be slidable along first LM guide rails respectively provided to the top end and the bottom end of the compression plate.

Each of the upper block and the lower block may include a motion block coupled to the cell pressing unit; and a static block coupled to the power supply, and the motion block may, be configured to move into and out of the static block.

The static block may include a cylinder chamber configured to accommodate a part of the motion block therein and an air injection hole formed at an outer side thereof to communicate with the cylinder chamber.

The pressurizing short-circuit inspection apparatus may further comprise a supporter provided below the compression plates to support the compression plates to be movable along the first axis.

The supporter may include a supporter block configured to extend along the first axis and disposed below opposite ends of the compression plates; a second LM guide rail provided along a top line of the supporter block; and second LM sliders respectively coupled to the compression plates and connected to be slidable along the first axis along the second LM guide rail.

Advantageous Effects

According to an embodiment of the present disclosure, since the pressurizing short-circuit inspection assembly is configured to move left and right along the top line of the compression plate, the pressurizing short-circuit inspection process and the cell pressurizing process for reducing the aging process time may be subsequently performed using a single device.

That is, since two processes may be integrated with the pressurizing short-circuit inspection apparatus, it is possible to improve product productivity (tact time) and save cost and space for building related facilities, compared to the existing technique.

According to another embodiment of the present disclosure, since an area having high possibility of a separator damage in the pouch-type secondary battery is intensively pressed with the pressurizing short-circuit inspection assembly, it is possible to effectively induce a temporary short-circuit state of the positive electrode and the negative electrode and apply a test voltage, thereby enhancing reliability of the pressurizing short-circuit inspection process.

In particular, it is possible to improve the accuracy of inspection by increasing the pressing force by means of point-pressing of the balls against the area where a separator damage is expected.

In addition, by moving the position of the cell pressing unit relative to the power supply unit, the area subject to separator damage inspection may be enlarged, if necessary.

Other effects not mentioned herein will be clearly understood by those skilled in the art from the following description.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

A pressurizing short-circuit inspection apparatus according to the present disclosure described below refers to a device for detecting a low-voltage defective cell caused by separator damage in advance, before a formation process for charging and discharging secondary battery cells to be activated in the process of manufacturing a pouch-type secondary battery.

In addition, as will be described later in detail, the pressurizing short-circuit inspection apparatus according to the present disclosure may also be used in a process of pressurizing the entire surface of the cell body for the purpose of promoting electrolyte impregnation of the electrode assembly, namely a cell pressurizing process, after the low-voltage defective cell inspection.

Figure 2:
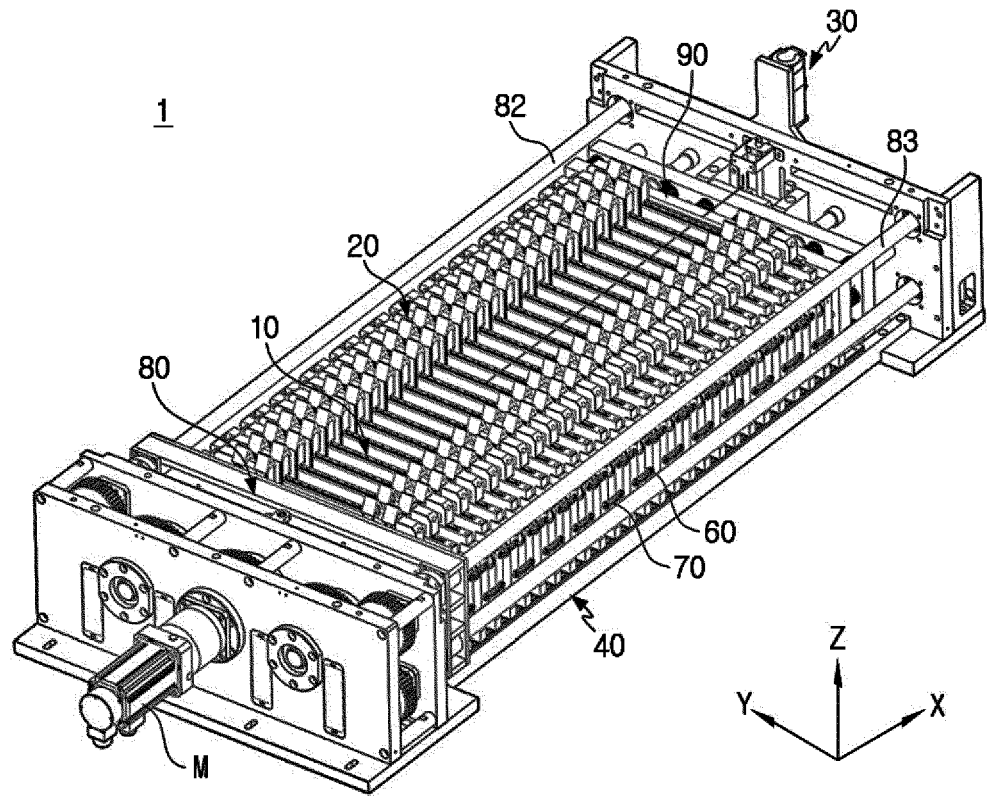
FIG. 2 is a perspective view schematically showing a pressurizing short-circuit inspection apparatus according to an embodiment of the present disclosure.
Figure 3:
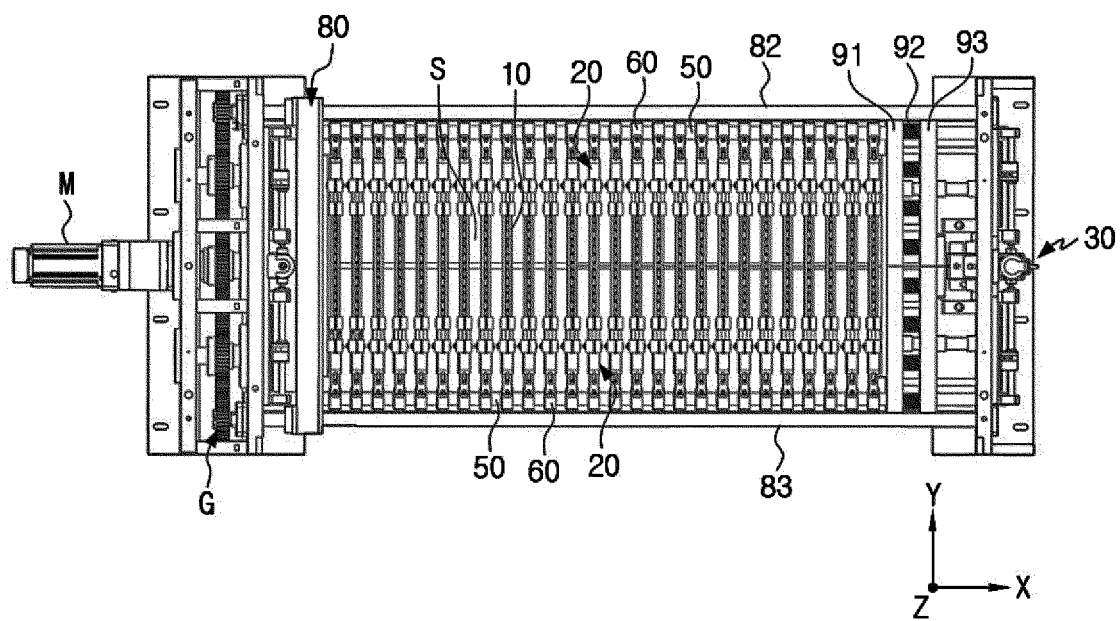
FIG. 3 is a plan view of FIG. 2.
Figure 4:
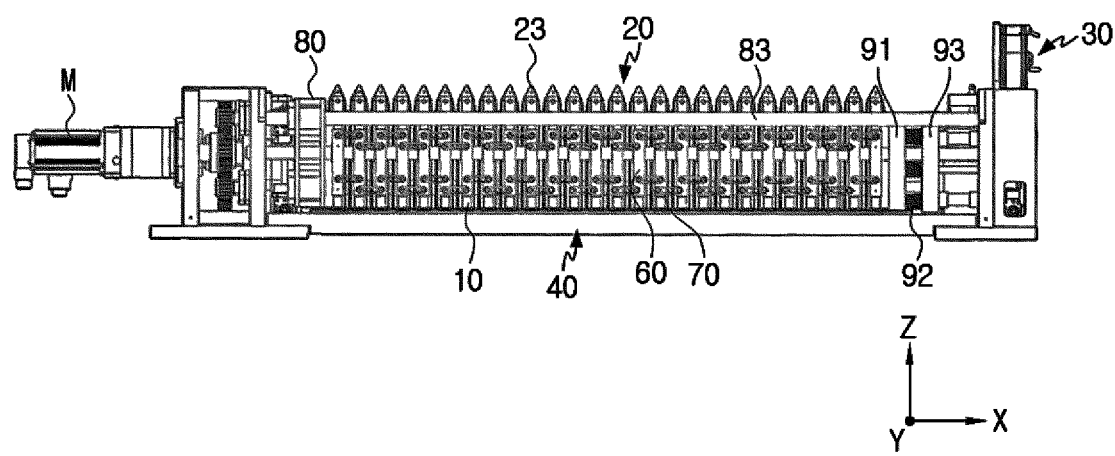
FIG. 4 is a side view of FIG. 2.

FIG. 2 is a perspective view schematically showing a pressurizing short-circuit inspection apparatus according to an embodiment of the present disclosure, and FIGS. 3 and 4 are a plan view and a side view of FIG. 2, respectively.

Referring to these drawings, the pressurizing short-circuit inspection apparatus 1 according to an embodiment of the present disclosure includes a compression plate 10, a pressurizing short-circuit inspection assembly 20, an inspection assembly adjusting unit 30, and a supporter unit 40.

The compression plates 10 are plate-shaped bodies with high mechanical stiffness without deformation even under high temperature and pressure, and are configured to sandwich pouch-type secondary battery cells 6 between them to pressurize both sides thereof. The compression plates 10 may be made not only of metal but also of any material with high mechanical rigidity such as reinforced plastic, reinforced ceramic or tempered glass.

The compression plates 10 are arranged in one direction (X-axis direction) with a predetermined separation distance so that their plate surfaces face each other, and may be moved along ±X-axis direction to increase or decrease the separation distance.

The inspection-target secondary battery cells 6 may be transported to a working chamber equipped with the pressurizing short-circuit inspection apparatus 1 in a state of being stored in a tray, or may be picked up by a cell pick-up instrument (not shown) and inserted into a space S between the compression plates 10 one by one.

The secondary battery cells 6 may be suspended at certain height by a sheet-shaped interlayer (not shown) interposed in advance in the space (S) between the compression plates 10, and both surfaces of the secondary battery cells 6 may be pressed by the compression plates 10.

Prior to explaining main components of the pressurizing short-circuit inspection assembly 20, the pressurizing short-circuit inspection method will be described briefly as follows.

Figure 1:
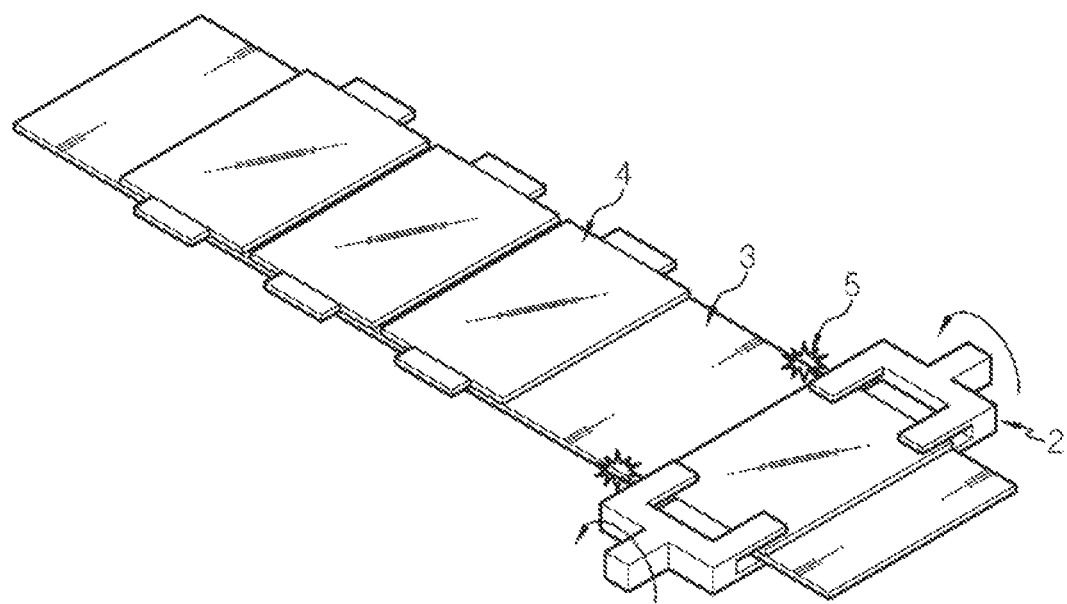
FIG. 1 is a reference view for illustrating a part of an assembling process of a stacking-and-folding cell according to the prior art.

When an electrode assembly is assembled, the part that is most likely to damage the separator is both edges of the separator (See FIG. 1). In case of a normal separator, even though the corresponding part is pressed, the positive electrode plate and the negative electrode plate do not contact each other because they are blocked by the separator. However, in case of a damaged separator, if the corresponding part is pressed, the positive electrode plate and the negative electrode plates may come into contact with each other through the damaged part of the separator, resulting in a short circuit.

For this reason, the pressurizing short-circuit inspection process may be carried out in a way of distinguish good cells and defective cells by pressing both edges of the body of the secondary battery cells 6, where separator damage occurs frequently, applying a constant test voltage thereto, and then measuring a leakage current.

When the test voltage is reached, in case of a good cell, the current is stabilized because there is little leakage current. However, in case of a defective cell, a short circuit occurs in a pressurized state, so the leakage current increases to maintain the test voltage. In this case, the leakage current may increase in proportion to the degree of separator damage.

The pressurizing short-circuit inspection assembly 20 according to the present disclosure is provided to apply the test voltage while intensively applying a pressure to the separator damage area, namely the edge of the cell body, to enable the pressurizing short-circuit inspection as above.

Two pressurizing short-circuit inspection assemblies 20 may be respectively installed at the compression plates 10 to operate symmetrically to each other.

Figure 5:
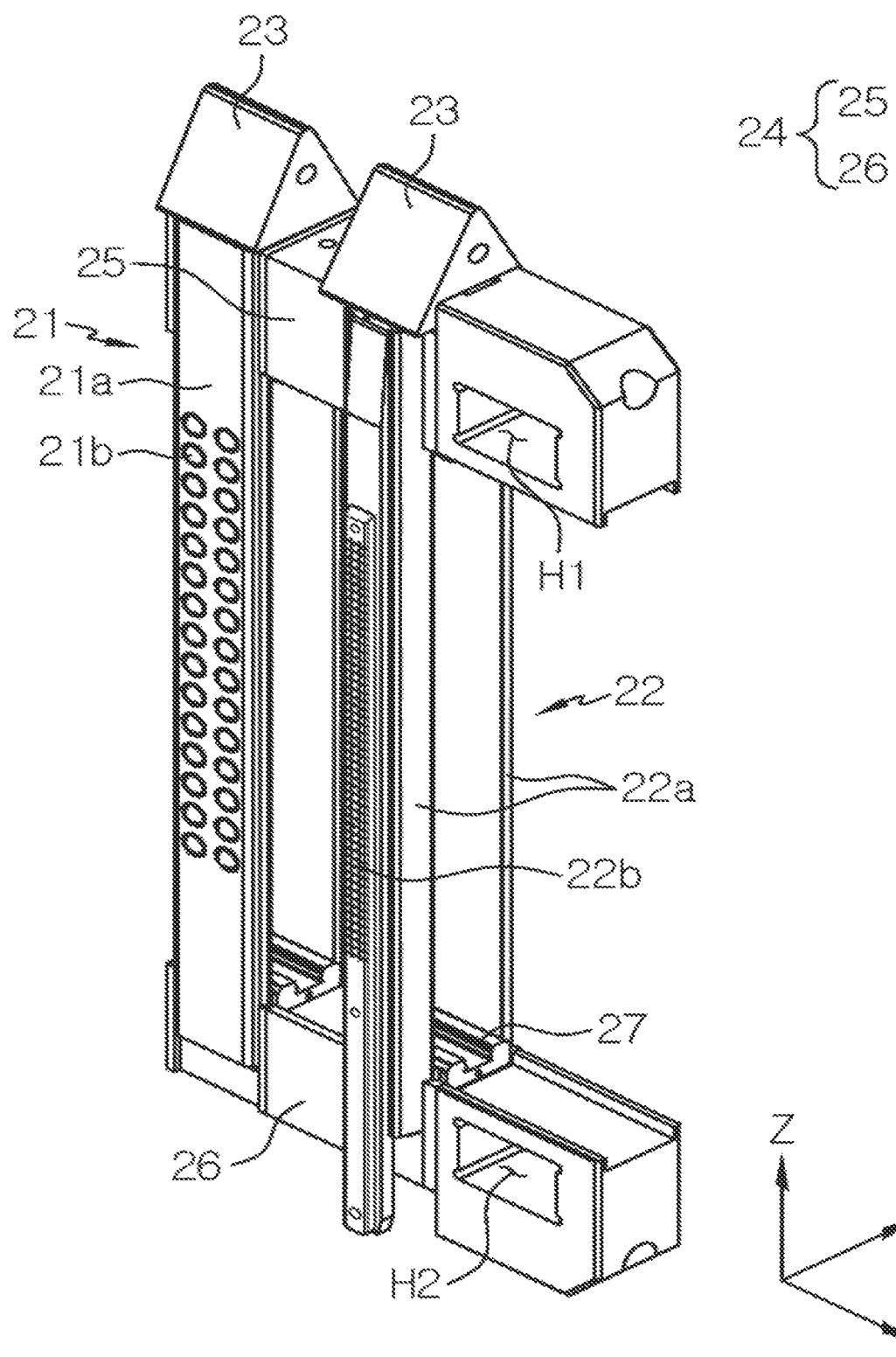
FIG. 5 is a perspective view showing a pressurizing short-circuit inspection assembly according to an embodiment of the present disclosure.
Figure 6:
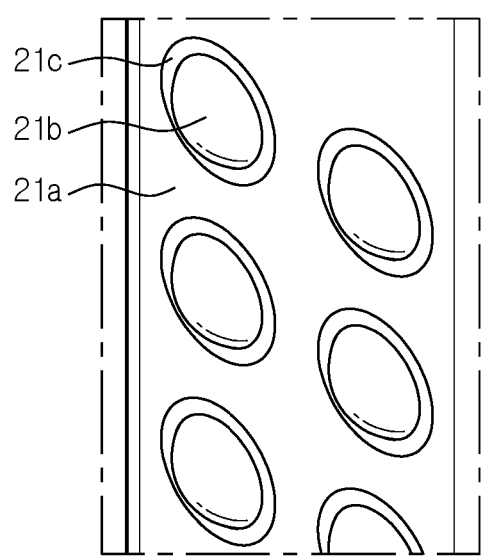
FIG. 6 is a partially enlarged view showing a pressurizing pad of FIG. 5.

Specifically, referring to FIGS. 5 and 6, the pressurizing short-circuit inspection assembly 20 includes a cell pressing unit 21 mounted to each of the compression plates 10 to be movable along ±Y-axis direction and configured to press a part of the body of the secondary battery cell 6, and a power supply unit 22 provided in contact with an electrode lead 6a of the secondary battery cell 6 to apply the test voltage thereto.

A part of the body of the secondary battery cell is a place with the highest possibility of separator damage while the secondary battery cell is being assembled, and both ends of the body of the secondary battery cell 6 may correspond thereto. (Here, the body of the secondary battery cell 6 refers to a part that forms the thickness of the secondary battery cell.)

The cell pressing unit 21 includes pressurizing pads 21a disposed to respectively overlap a front surface and a rear surface of the compression plate 10 to have a width corresponding to the edge area of the cell body and elongated in a vertical direction, and balls 21b having a spherical shape and partially embedded in the pressurizing pads 21a.

The balls 21b may be provided on the pressurizing pad 21a by, for example, assembling so that the balls 21b are respectively inserted into ball holders 21c and then the ball holder 21c are fitted into grooves formed in advance at the pressurizing pad 21a.

For example, if the entire surface of the body of the secondary battery cell 6 is pressed by the compression plate 10 using a pressurizing motor M of a specific capacity, a pressure of about 5 kgf/cm$^2$ per unit area is applied. However, if the cell pressing unit 21 is moved to an edge area of the body of the secondary battery cell, since only the edge area of the body of the secondary battery cell 6 body is pressed by the pressurizing pad 21a, a pressure of about 34 kgf/cm$^2$ per unit area may be applied to the corresponding area.

For reference, the pressure of about 5 kgf/cm$^2$ per unit area may be a pressure required during the cell pressurizing process, and the pressure of about 34 kgf/cm$^2$ per unit area may be a pressure required during the pressurizing short-circuit test.

In particular, since the pressurizing pad 21a according to the present disclosure includes the balls 21b, the edge area of the cell body is point-pressed, and thus the pressing force of the corresponding area may be increased compared to the case where the surface is pressed.

In addition, as will be described later, the balls 21b on the pressurizing pad 21a are configured to rotate in the forward/reverse direction, so that the cell pressing unit 21 may be moved along the ±Y-axis direction with respect to the power supply unit 22 in a state of pressing the cell body.

The power supply unit 22 includes terminal support 22a disposed to respectively overlap with a front surface and a rear surface of the compression plate 10, and a voltage terminal 22b attached to at least one of the terminal supports 22a, and is integrally provided with the cell pressing unit 21 to move together with the cell pressing unit 21 with a predetermined distance.

The power supply unit 22 may be placed at a position where the voltage terminal 22b may contact the electrode lead 6a, when the cell pressing unit 21 contacts both surfaces of the body of the secondary battery cell 6.

The pressurizing short-circuit inspection assembly 20 further includes a cell entry guide 23 and a structure-reinforcing block unit 24.

The cell entry guide 23 is disposed at the upper portion of the cell pressing unit 21 and the power supply unit 22, and may be provided to have an inclined or curved surface along which the secondary battery cell 6 may slide downward.

The cell entry guide 23 is a cell pick-up instrument (not shown) and may serve to guide the secondary battery cells 6 to be inserted to a correct position when the secondary battery cells 6 are picked up and inserted into the space between the compression plates 10.

The structure-reinforcing block unit 24 is a component to prevent the cell pressing unit 21 or the power supply unit 22 from tilting by connecting the cell pressing unit 21 and the power supply unit 22 into a single body and also to provide mobility thereto.

The structure-reinforcing block unit 24 includes an upper block 25 and a lower block 26.

The upper block 25 may connect top portions of the cell pressing unit 21 and the power supply unit 22 and be mounted at a top end of the compression plate 10 to be slidable along a top line of the compression plate 10.

The lower block 26 may connect bottom portions of the cell pressing unit 21 and the power supply unit 22 and be mounted at a bottom end of the compression plate 10 to be slidable along a bottom line of the compression plate 10.

Figure 9:
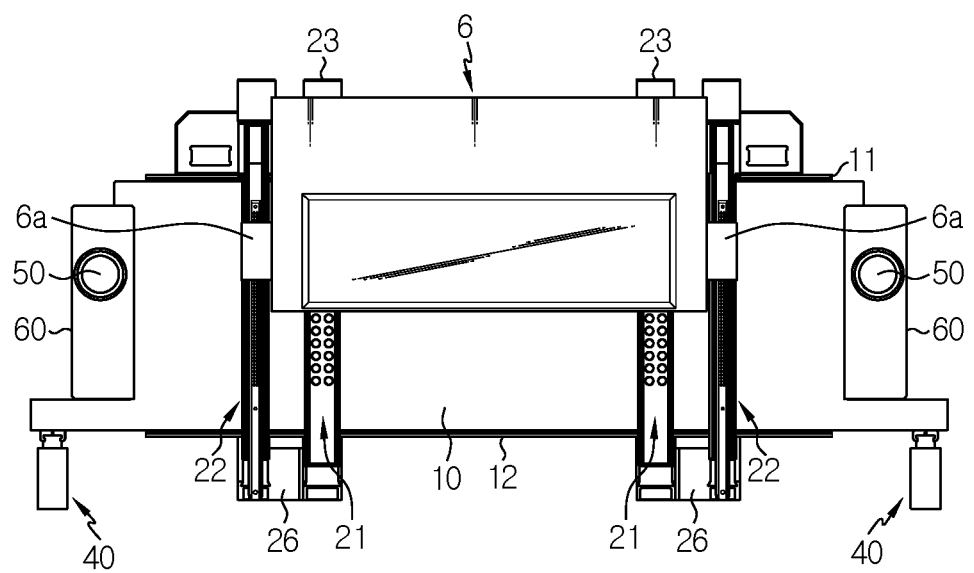
FIGS. 9 to 11 are reference diagrams for illustrating a pressurizing short-circuit inspection process and a cell pressurizing process according to an embodiment of the present disclosure.

More specifically, as shown in FIG. 5, the upper block 25 and the lower block 26 may include a first LM slider 27, respectively, and first LM guide rails 11, 12 forming a linear movement path of the first LM slider 27 may be provided on the top line and the bottom line of the compression plate 10 (see FIG. 9). In this configuration, the upper block 25 and the lower block 26 may slide along the ±Y-axis direction with respect to the compression plate 10.

Since the cell pressing unit 21 and the power supply unit 22 are connected by the upper block 25 and the lower block 26 and their top and bottom portions are supported respectively, the cell pressing unit 21 and the power supply unit 22 may stably move in the ±X-axis or ±Y-axis direction and are not tilted when pressing the secondary battery cell.

In the pressurizing short-circuit inspection assembly 20 according to the present disclosure, the cell pressing unit 21 may move along the ±Y-axis direction with respect to the power supply unit 22.

Figure 7:
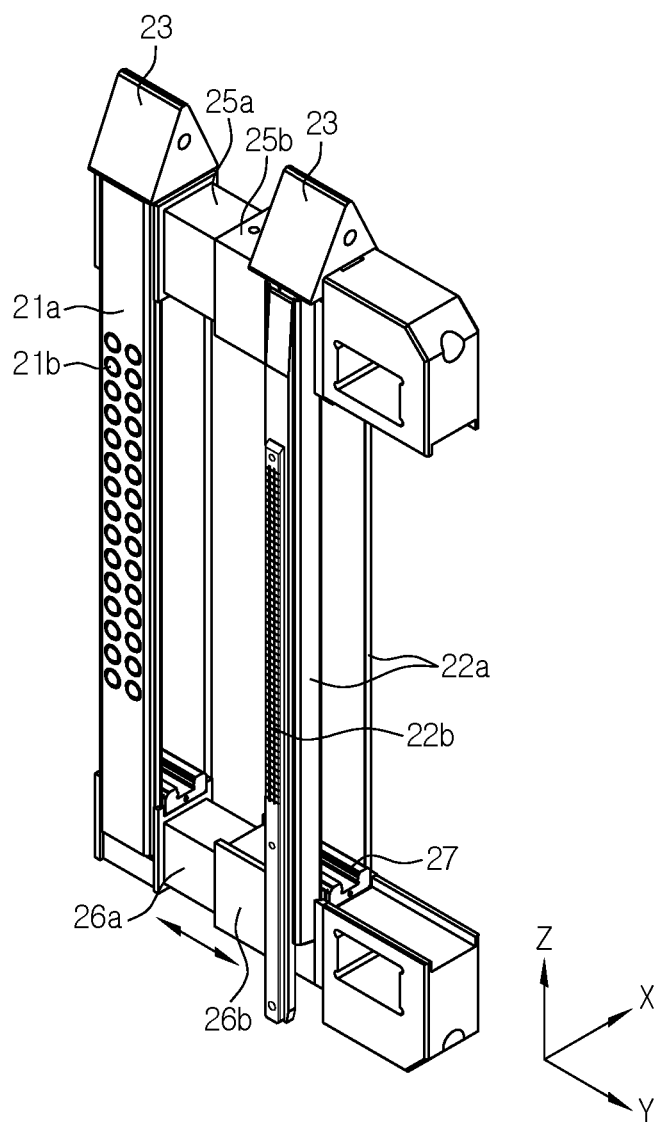
FIG. 7 is a perspective view showing a pressurizing short-circuit inspection assembly formed by extending a cell pressing unit of FIG. 5 in an Y-axis direction.
Figure 8:
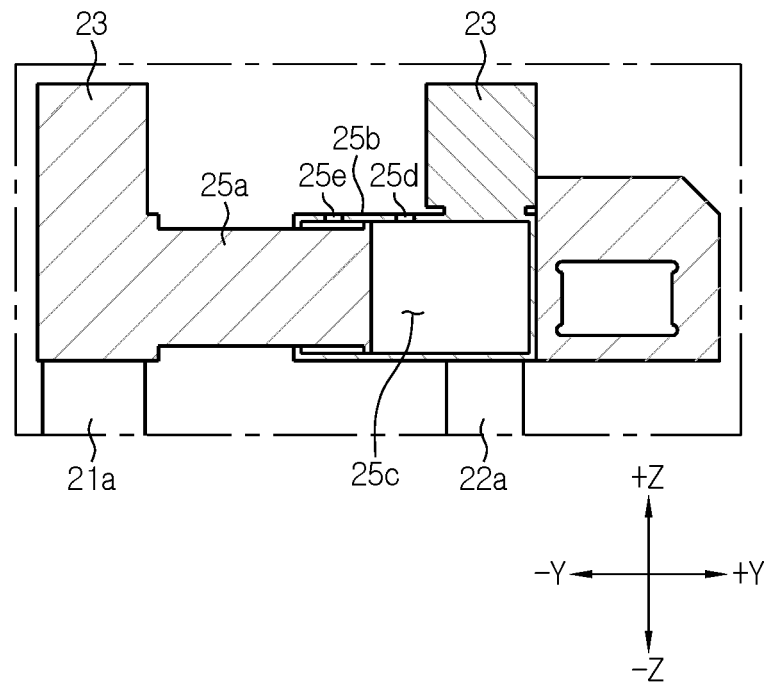
FIG. 8 is a schematic sectional view showing an upper block of FIG. 7.

To this end, referring to FIGS. 5, 7 and 8, the upper block 25 and the lower block 26 may respectively include motion blocks 25a, 26a coupled to the cell pressing unit 21 and static blocks 25b, 26b coupled to the power supply unit 22.

The motion blocks 25a, 26a have a predetermined length, one end of which is fixed to the cell pressing unit 21 and the other end of which is in the form of a shaft inserted into the motion blocks 25b, 26b. Also, the static blocks 25b, 26b may include a cylinder chamber 25c having an empty space therein so that the motion blocks 25a, 26a may move in and out, and air injection holes 25d, 25e provided at an outer side thereof to communicate with the cylinder chamber 25c.

For example, in FIG. 8, if air is injected into the cylinder chamber 25c through the first air injection hole 25d, a pneumatic pressure of the cylinder acts in a positive direction (−Y-axis direction) so that motion blocks 25a, 26a are drawn out of the static blocks 25b, 26b. Also, if air is injected into the cylinder chamber 25c through the second air injection hole 25e, the pneumatic pressure of the cylinder acts in a reverse direction (+Y-axis direction) so that motion blocks 25a, 26a may be introduced into the static blocks 25b, 26b. That is, the motion blocks 25a, 26a may reciprocate into and out of the static blocks 25b, 26b by the pneumatic pressure. Of course, a hydraulic pressure may be used instead of the pneumatic pressure.

In the embodiment of the present disclosure, the motion blocks 25a, 26a are configured to operate by a pneumatic pressure, but any operating mechanism capable of reciprocating the motion blocks 25a, 26a with respect to the static blocks 25b, 26b may also be used instead of the pneumatic or hydraulic method.

By the configuration and operation as described above, the pressurizing short-circuit inspection assembly 20 may adjust the separation distance between the cell pressing unit 21 and the power supply unit 22, and thus the range of the cell body for pressurizing short-circuit inspection may be broadened.

Figure 10:
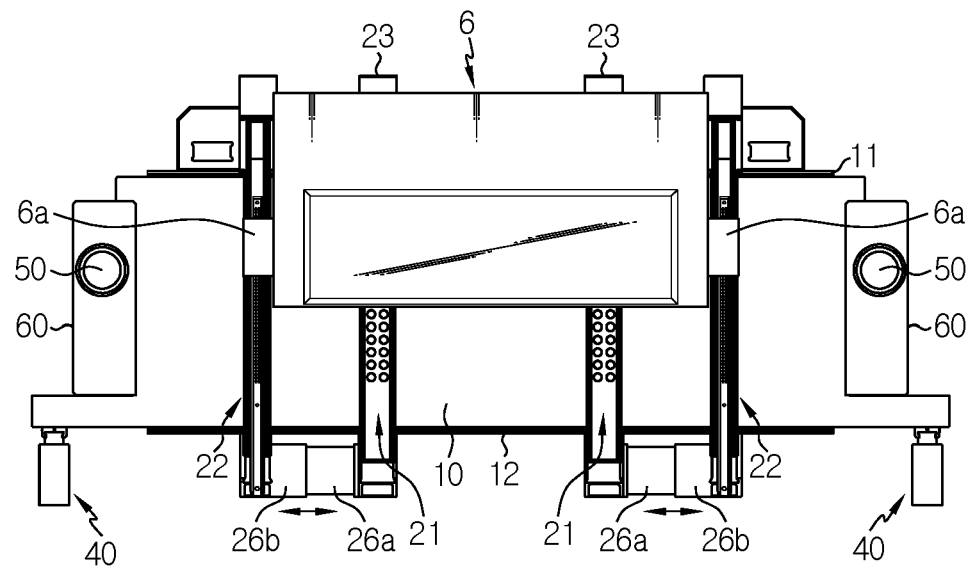

That is, the pressurizing short-circuit inspection process may be performed using a simple inspection method in which the edge area of the cell body is pressed with the cell pressing unit 21 and a test voltage is applied by the power supply unit 22 to measure an amount of leakage current at this time to determine whether it is defective as shown in FIG. 9, or an expanded inspection method in which the cell pressing unit 21 is reciprocated between the edge of the cell body and the center of the cell body and an amount of leakage current is measured to determine whether it is defective as shown in FIG. 10.

In the expanded inspection method, the cell pressing unit 21 reciprocates together with the motion blocks 25a, 26a, and the plurality of balls 21b embedded in the pressurizing pad 21a may roll-press the cell body during the reciprocating movement. In this embodiment, the balls 21b are employed on the pressurizing pad 21a, but a roller may also be employed as an alternative to the balls 21b.

According to the expanded inspection method, a defective cell is a cell at which a leakage current is measured while the cell body is roll-pressed. In addition, based on the time when the leakage current is measured and the location of the pressurizing pad 21a, the location of the separator damage may also be estimated.

Meanwhile, the pressurizing short-circuit inspection assemblies 20 may perform correct inspection only when all pressurizing short-circuit inspection assemblies 20 are moved simultaneously and precisely in a lump. To this end, the pressurizing short-circuit inspection apparatus 1 of the present disclosure may further include an inspection assembly adjusting unit 30 for moving the pressurizing short-circuit inspection assemblies 20 in a lump.

Figure 12:
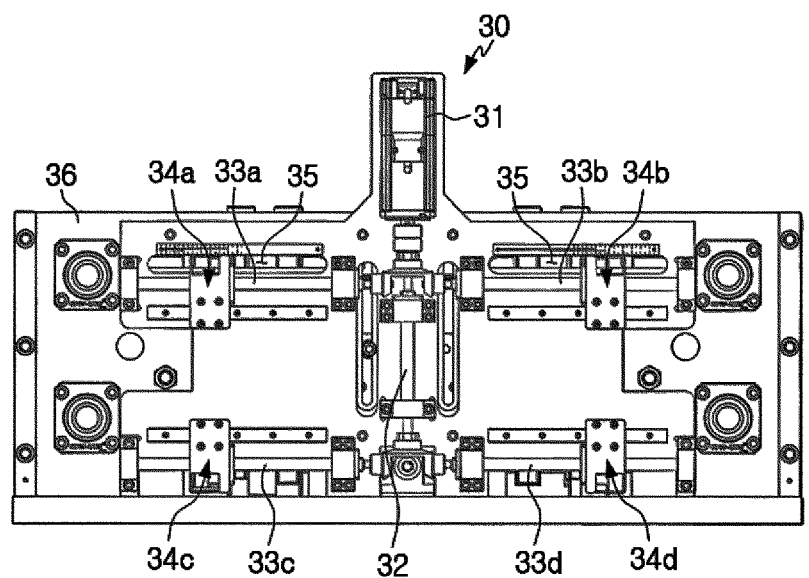
FIG. 12 is a diagram for illustrating an inspection assembly adjusting unit according to an embodiment of the present disclosure.
Figure 13:
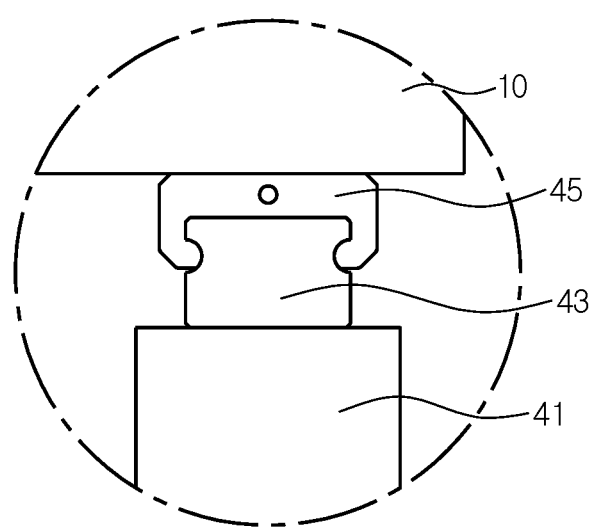
FIG. 13 is an enlarged view showing a region A of FIG. 11.
Figure 14:
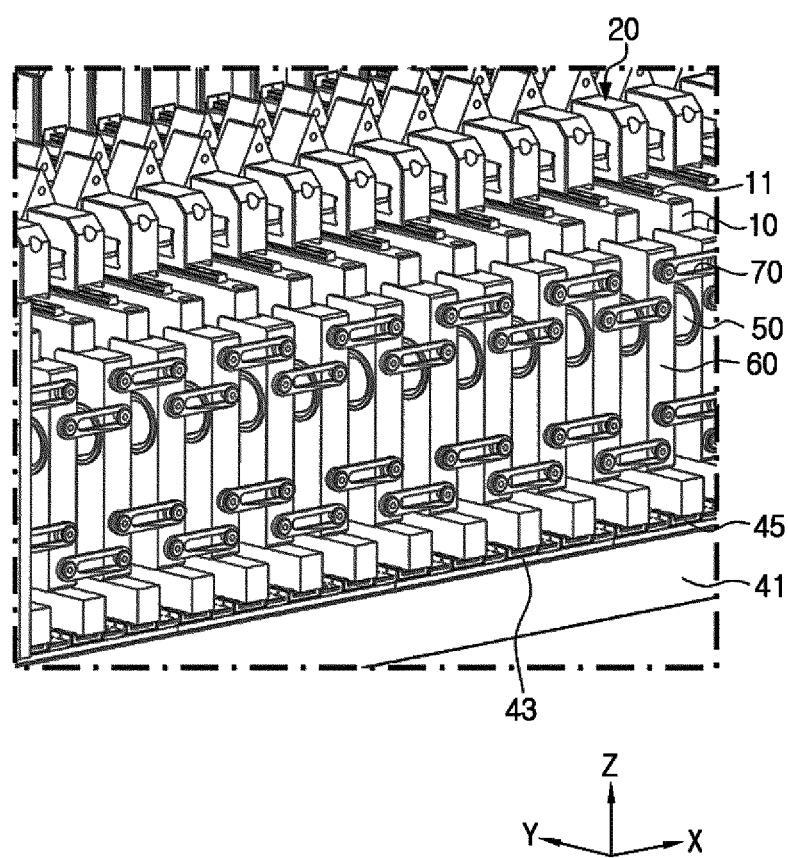
FIG. 14 is a partially enlarged view for illustrating a connection structure among a supporter unit, a support shaft, moving blocks and compression plates.

Referring to FIGS. 2, 3 and 12 together, the inspection assembly adjusting unit 30 may include an adjustment motor 31 located out of a rear frame 36 of the housing of the pressurizing short-circuit inspection apparatus 1 to provide a drive force, a vertical shaft 32 connected to the adjustment motor 31 and disposed to extend vertically, horizontal shafts 33a to 33d connected to the vertical shaft 32 by a bevel gear and disposed to extend horizontally, and adjustment LM blocks 34a to 34d connected to the horizontal shafts 33a to 33d to be movable in the left and right direction.

The horizontal shafts 33a to 33d include a first horizontal shaft 33a and a second horizontal shaft 33b disposed to extend left and right in an upper area based on the vertical shaft 32, and a third horizontal shaft 33c and a fourth horizontal shaft 33d disposed to extend left and right in a lower area based on the vertical shaft 32.

In addition, the adjustment LM blocks 34a to 34d include a first adjustment LM block 34a connected to the first horizontal shaft 33a, a second adjustment LM block 34b connected to the second horizontal shaft 33b, a third adjustment LM block 34c connected to the third horizontal shaft 33c, and a fourth adjustment LM block 34d connected to the fourth horizontal shaft 33d.

The first and second adjustment LM blocks 34a, 34b may be connected to the upper blocks 25 of the pressurizing short-circuit inspection assemblies 20 by means of first and second adjustment shafts (not shown) extending in the X-axis direction, and the third and the fourth adjustment LM blocks 34c, 34d may be connected to the lower blocks 26 of the pressurizing short-circuit inspection assemblies 20 by means of third and fourth adjustment shafts (not shown) extending in the X-axis direction.

Although not shown, one sides of the first to fourth adjustment shafts may be respectively coupled to correspond to the first to fourth adjustment LM blocks 34a to 34d, pass through the guide holes 35 of the rear frame 36, and pass through perforated holes H1, H2 provided in the body of the upper block 25 or the body of the lower block 26.

Therefore, all pressurizing short-circuit inspection assemblies 20 may be connected to the first to fourth adjustment blocks 34a to 34d, which are moved left and right by the adjustment motor 31, to move in a bundle in the right and left direction (±Y-axis direction) with respect to the pressing plates corresponding thereto in one-to-one relationship.

According to the inspection assembly adjusting unit 30, while the pressurizing short-circuit process is performed, the cell pressing unit 21 may move the pressurizing short-circuit inspection assemblies 20 in a bundle to a first position that faces the body of the inspection-target secondary battery cell 6, and after the pressurizing short-circuit process is completed, the pressurizing short-circuit inspection assemblies 20 may be moved again in a bundle to a second position that does not face the body of secondary battery cell 6.

Referring to FIGS. 2, 11, 13 and 14, the pressurizing short-circuit inspection apparatus 1 according to this embodiment may further include a supporter unit 40 provided below the compression plates 10 to support the compression plates 10 to be movable in the X-axis direction.

The supporter unit 40 may include a pair of supporter blocks 41 configured to extend along the arrangement direction of the compression plates 10 and respectively disposed below both ends of the compression plates 10, a second LM guide rail 43 provided along a top line of the supporter block 41, and second LM sliders 45 respectively coupled to the compression plates 10 and connected to be slidable in the ±X-axis direction along the second LM guide rail 43.

By means of the supporter unit 40 configured as above, the compression plates 10 may stably slide in the ±X-axis direction in a state of standing upright.

In addition, the pressurizing short-circuit inspection apparatus 1 may further include a support shaft 50 disposed at both side areas of the compression plates 10 to extend along the X-axis direction, moving blocks 60 disposed at both side areas of the compression plates 10 so that the support shaft 50 may that pass through a body thereof, the moving blocks 60 being coupled to the compression plates 10 in one-to-one relationship, and link members 70 configured to connect the moving blocks 60 to each other.

Each of the moving blocks 60 may hold both side areas of compression plates 10 and move in the ±X-axis direction along the support shaft 50. For smooth movement of the moving blocks 60, bearings may be provided at a portion where the moving blocks 60 and the support shaft 50 are connected.

According to this configuration, both side areas of each compression plate 10 are supported by the moving blocks 60 and the support shaft 50 so as not to be tilted in the left and right directions during operation. In addition, since the moving blocks 60 may be connected to each other by the link members 70, the compression plates 10 may be moved integrally while maintaining a certain distance therebetween.

In addition, referring to FIGS. 2 and 3 again, the pressurizing short-circuit inspection apparatus 1 of this embodiment may further include a main compression plate 80 configured to push or pull the compression plates 10 in the ±X-axis direction, and a buffering unit 90 configured to absorb a pressing force transmitted from the main compression plates 80 to the compression plates 10.

The main compression plate 80 is connected so that its one surface faces a compression plate 10 located at the foremost side among the compression plates 10 along the arrangement direction of the compression plates 10, and TM screw shafts 82, 83 pass through corner areas of the main compression plate 80.

The main compression plate 80 is connected so that its one surface faces a compression plate 10 located at the foremost side among the compression plates 10 along the arrangement direction of the compression plates 10, and trapezoidal metric (TM) screw shafts 82, 83 pass through corner areas of the main compression plate 80.

The main compression plate 80 may be moved forward or backward when the TM screw shafts 82, 83 rotate in the forward or reverse direction. For example, if the TM screw shafts 82, 83 are rotated in the forward direction, the main compression plate 80 moves forward to push the compression plates 10 in the +X-axis direction toward the buffering unit 90. Accordingly, the gap of the compression plates 10 between the main compression plate 80 and the buffering unit 90 gradually narrows to press the secondary battery cells 6.

Conversely, if the TM screw shafts 82, 83 are rotated in the reverse direction, the main compression plate 80 is moved rearward to pull the compression plate 10 at the foremost side in the −X-axis direction. At this time, since the compression plates 10 are connected to each other by the link members 70, if the compression plate 10 at the foremost side is pulled, all compression plates 10 are pulled and moved in the −X-axis direction.

Meanwhile, the buffering unit 90 may include a first buffer plate 91 connected to face the compression plate 10 located at the rearmost side among the compression plates 10, and a second buffer plate 93 disposed to face the first buffer plate 91 with elastic members 92 being interposed therebetween.

By means of the buffering unit 90 configured as above, the compression plates 10 pushed in the +X-axis direction by the main compression plate 80 may be elastically supported to effectively reduce the impact applied to the compression plates 10.

If the pressurizing short-circuit inspection apparatus 1 according to an embodiment of the present disclosure as described above is used, the pressurizing short-circuit inspection process and the cell pressurizing process may be integrated. Hereinafter, a method of utilizing the pressurizing short-circuit inspection apparatus 1 will be briefly described.

The subsequent process for a defective cell after the assembling process is only related to a loss. Therefore, it is desirable to detect a defective cell by performing the pressurizing short-circuit inspection process immediately after the assembling process for the secondary battery cell 6 is completed.

First, when the pressurizing short-circuit inspection process is performed, as shown in FIG. 9, the pressurizing short-circuit inspection assemblies 20 are moved to the inside of the compression plates 10 along the Y-axis direction and placed at a first position. Here, the first position refers to a position where both edges of the body of the inspection-target secondary battery cell 6 and the pressurizing pads 21a face each other.

After that, the pressurizing motor M is operated to intensively press the edge area of the secondary battery cells 6 with a pressure of about 34 kgf/cm$^2$, and a test voltage is applied to determine whether a leakage current occurs, thereby detecting a defective cell.

If the pressurizing short-circuit inspection process is completed in the above way, the cell pressurizing process is carried out immediately. The cell pressurizing process is a process to shorten a pre-aging time by pressing the entire surface of the body of the secondary battery cell 6 to remove internal air bubbles. If the cell pressurizing process is performed, there is an advantage that the time required for pre-aging may be shortened by about 1 to 2 days compared to when the cell pressurizing process is not performed.

Figure 11:
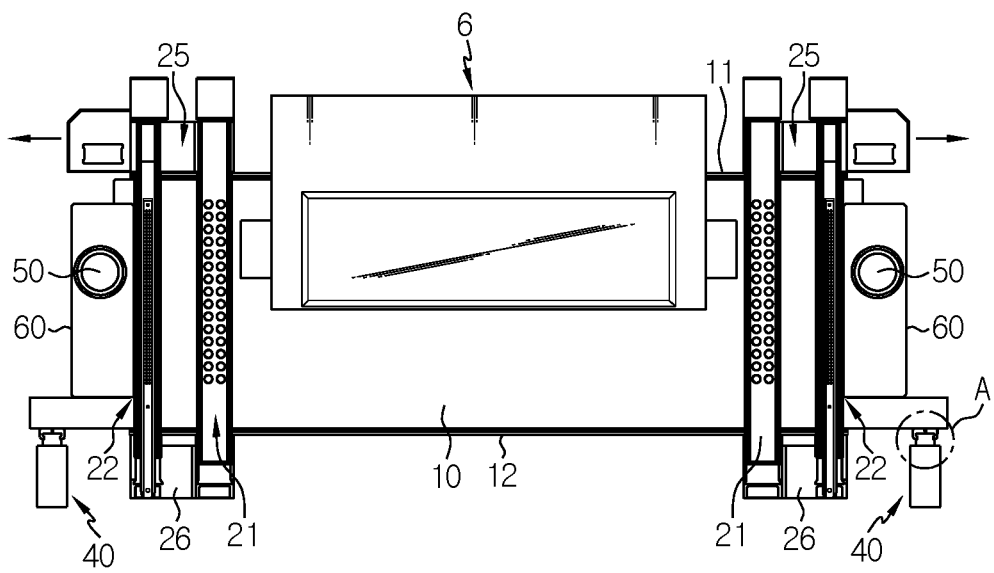

When the cell pressurizing process is performed, as shown in FIG. 11, the pressurizing short-circuit inspection assemblies 20 are moved out of the compression plates 10 along the Y-axis direction and placed at a second position. Here, the second position refers to a position where the secondary battery cell 6 after the pressurizing short-circuit inspection is completed and the pressurizing short-circuit inspection assembly 20 do not face each other.

After that, the pressurizing motor M is operated again to completely press the entire surface of the body of the secondary battery cell 6 with the compression plates 10. At this time, the entire surface of the body of the secondary battery cell 6 is pressed with a pressure of about 5 kgf/cm$^2$ for a preset time.

As described above, according to the pressurizing short-circuit inspection apparatus 1 of this embodiment, the pressurizing short-circuit inspection process and the cell pressurizing short-circuit process, which require different pressure bands, may be integrally performed using one device, and thus it is possible to reduce tack time and save the space and cost required for building production facilities.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, even though the terms expressing directions such as "upper", "lower", "left" and "right" are used in the specification, they are just for convenience of description and can be expressed differently depending on the location of a viewer or a subject, as apparent to those skilled in the art.

What is claimed is:

1. A pressurizing short-circuit inspection apparatus, comprising:
   compression plates arranged with a predetermined separation distance therebetween so that at least one secondary battery cell is insertable therebetween, the compression plates being movable along a first axis to adjust the separation distance; and
   a pressurizing short-circuit inspection assembly having a cell pressing unit configured to be pressable against a predetermined region of a body of the secondary battery cell and a power supply configured to be contactable with an electrode lead of the secondary battery cell to apply a test voltage, the cell pressing unit and the power supply of the pressurizing short-circuit inspection assembly being mounted to the compression plates to be movable with respect to the compression plates along a second axis perpendicular to the first axis,
   wherein the cell pressing unit includes balls provided at at least one surface thereof to be pressable against the body of the secondary battery cell.

2. The pressurizing short-circuit inspection apparatus according to claim 1, wherein the cell pressing unit includes pressurizing pads respectively disposed to overlap with a front surface and a rear surface of each compression plate, and
   wherein the balls have a spherical shape and are partially embedded in the pressurizing pad.

3. The pressurizing short-circuit inspection apparatus according to claim 1, wherein the cell pressing unit is connected to the power supply and configured to move along the second axis with respect to the power supply.

4. The pressurizing short-circuit inspection apparatus according to claim 1, further comprising:
   a supporter provided below the compression plates to support the compression plates to be movable along the first axis.

5. The pressurizing short-circuit inspection apparatus according to claim 4, wherein the supporter includes:
   a supporter block configured to extend along the first axis and disposed below opposite ends of the compression plates;

a second linear motion (LM) guide rail provided along a top line of the supporter block; and second LM sliders respectively coupled to the compression plates and connected to be slidable along the first axis along the second LM guide rail.

6. A pressurizing short-circuit inspection apparatus, comprising:

compression plates arranged with a predetermined separation distance therebetween so that at least one secondary battery cell is insertable therebetween, the compression plates being movable along a first axis to adjust the separation distance; and a pressurizing short-circuit inspection assembly having a cell pressing unit configured to be pressable against a predetermined region of a body of the secondary battery cell and a power supply configured to be contactable with an electrode lead of the secondary battery cell to apply a test voltage, the pressurizing short-circuit inspection assembly being mounted to the compression plates to be movable along a second axis perpendicular to the first axis, wherein the cell pressing unit includes balls provided at at least one surface thereof to be pressable against the body of the secondary battery cell, and wherein the cell pressing unit and the power supply are provided to be moved together along the first axis.

7. A pressurizing short-circuit inspection apparatus, comprising:

compression plates arranged with a predetermined separation distance therebetween so that at least one secondary battery cell is insertable therebetween, the compression plates being movable along a first axis to adjust the separation distance; and a pressurizing short-circuit inspection assembly having a cell pressing unit configured to be pressable against a predetermined region of a body of the secondary battery cell and a power supply configured to be contactable with an electrode lead of the secondary battery cell to apply a test voltage, the pressurizing short-circuit inspection assembly being mounted to the compression plates to be movable along a second axis perpendicular to the first axis, wherein the cell pressing unit includes balls provided at at least one surface thereof to be pressable against the body of the secondary battery cell, wherein the pressurizing short-circuit inspection assembly further includes a structure-reinforcing block unit configured to connect the cell pressing unit and the power supply into a single body, and wherein the structure-reinforcing block unit includes:

an upper block configured to connect top portions of the cell pressing unit and the power supply and mounted to a top end of each compression plate to be slidable thereon; and a lower block configured to connect bottom portions of the cell pressing unit and the power supply and mounted to a bottom end of the compression plate to be slidable thereon.

8. The pressurizing short-circuit inspection apparatus according to claim 7, wherein the upper block and the lower block include first linear motion (LM) sliders provided to be slidable along first LM guide rails respectively provided to the top end and the bottom end of the compression plate.

9. The pressurizing short-circuit inspection apparatus according to claim 7, wherein each of the upper block and the lower block includes:

a motion block coupled to the cell pressing unit; and a static block coupled to the power supply, wherein the motion block is configured to move into and out of the static block.

10. The pressurizing short-circuit inspection apparatus according to claim 9, wherein the static block includes a cylinder chamber configured to accommodate a part of the motion block therein and an air injection hole formed at an outer side thereof to communicate with the cylinder chamber.

* * * * *